United States Patent
Caggiano et al.

(10) Patent No.: US 7,252,543 B2
(45) Date of Patent: Aug. 7, 2007

(54) METHODS AND SYSTEMS FOR MEASURING SYSTEM LOADS AND SUB-METERING ELECTRIC POWER DISTRIBUTION

(75) Inventors: Robert J. Caggiano, Wolcott, CT (US); Suresh Redditha, Hyderabad (IN); Raghunath T. Prabhu, Secunderabad (IN); Derek William Fritz, Rocky Hill, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/006,866

(22) Filed: Dec. 8, 2004

(65) Prior Publication Data

US 2006/0121785 A1 Jun. 8, 2006

(51) Int. Cl.
*H01R 31/08* (2006.01)
(52) U.S. Cl. ..................................... 439/508
(58) Field of Classification Search ................. 702/62; 361/63, 64; 439/508, 517
See application file for complete search history.

(56) References Cited

U.S. PATENT DOCUMENTS 6,268,989 B1    7/2001  Dougherty et al.
6,728,646 B2 *  4/2004  Howell et al. ................. 702/62
6,788,508 B2    9/2004  Papallo, Jr. et al.
6,865,073 B2 *  3/2005  Werner et al. ............... 361/624
2002/0010690 A1 1/2002  Howell et al.
2003/0158677 A1 8/2003  Swarztrauber et al.
2004/0174664 A1 9/2004  Werner et al.
2004/0186672 A1 9/2004  Howell et al.

* cited by examiner

*Primary Examiner*—Chandrika Prasad
(74) *Attorney, Agent, or Firm*—Rodney M. Young; Armstrong Teasdale LLP

(57) ABSTRACT

Methods and systems for electrical distribution submetering are provided. The electrical distribution submetering system includes a modular load sensing assembly including a plurality of load sensors. The load sensing assembly further includes a first cable having a first cable termination connector, an interface board including a plurality of electrical terminations, at least some of the terminations electrically coupled to a second cable having a second cable termination connector coupled to at least one conductor of the second cable, the second cable termination connector being complementary to the first cable termination connector such that the first cable termination connector and the second cable termination connector are configured to be electrically coupled. The submetering system also includes a modular sub metering electronics communicatively coupled to the interface board, the modular sub metering electronics configured to determine a branch circuit load in the electrical distribution system using the detected electrical load.

22 Claims, 4 Drawing Sheets

METHODS AND SYSTEMS FOR MEASURING SYSTEM LOADS AND SUB-METERING ELECTRIC POWER DISTRIBUTION

BACKGROUND OF THE INVENTION

This invention relates generally to electric distribution panels, and more particularly to methods and systems for submetering power delivered from electric distribution panels.

At least some government entities, such as states are permitting and in some cases requiring the deregulation of wholesale electricity distribution. In such areas, electricity distribution to an individual customer was limited to a regulated utility entity. With new regulations in effect, a landlord, such as an apartment building owner may now purchase bulk power for the apartment building and resell the power to the individual apartment dwellers. Heretofore, the metering of power distributed to individual apartment was performed by individual demand meters owned by the regulated utility and corresponding to each apartment. A new metering scheme, to take advantage of the deregulated environment, may allow for only one utility electric demand meter per apartment building, however, load to each individual apartment must still be determined for proper billing purposes.

BRIEF DESCRIPTION OF THE INVENTION

In one aspect, a system for electrical distribution submetering are provided. The electrical distribution submetering system includes a modular load sensing assembly including a plurality of load sensors. The load sensing assembly further includes a first cable having a first cable termination connector, an interface board including a plurality of electrical terminations, at least some of the terminations electrically coupled to a second cable having a second cable termination connector coupled to at least one conductor of the second cable, the second cable termination connector being complementary to the first cable termination connector such that the first cable termination connector and the second cable termination connector are configured to be electrically coupled. The submetering system also includes a modular sub metering electronics communicatively coupled to the interface board, the modular sub metering electronics configured to determine a branch circuit load in the electrical distribution system using the detected electrical load.

In another aspect, a load sensing assembly is provided. The assembly includes a plurality of load sensors configured to be communicatively coupled to respective load carrying branch circuit conductors, the plurality of load sensors configured to generate a load signal proportional to the load carried in the respective branch circuit conductors, a plurality of output leads, each output lead coupled to an output of a respective load sensor, the output leads coupled to a termination connector comprising a first shape and a plurality of pin connections, the pin connections configured to mate in one-to-one correspondence with the output leads, the first shape configured to mate to a complementary second-shaped connector, and an L-bracket comprising a poke-yoke configuration that facilitates preventing installation of the L-bracket in other than a predetermined orientation, the L-bracket configured to support the plurality of load sensors in substantial alignment with respective load carrying branch circuit conductors.

In yet another aspect, a method of measuring sub-branch loads in an electrical distribution panel is provided. The method includes mounting a load sensing assembly proximate a branch circuit breaker at least partially within the distribution panel, the load sensing assembly including a plurality of load sensors, each load sensor configured to generate an output signal that is proportional to an electrical load in a respective branch circuit, each load sensor comprising at least one output signal lead electrically coupled to a first termination connector, coupling the at least one output signal lead to a respective signal wire using the first termination connector and a complementary second termination connector electrically coupled to the signal wires, and determining, using the respective branch circuit load signals, a load profile for at least a portion of the branch circuits.

DETAILED DESCRIPTION OF THE INVENTION

Figure 1:
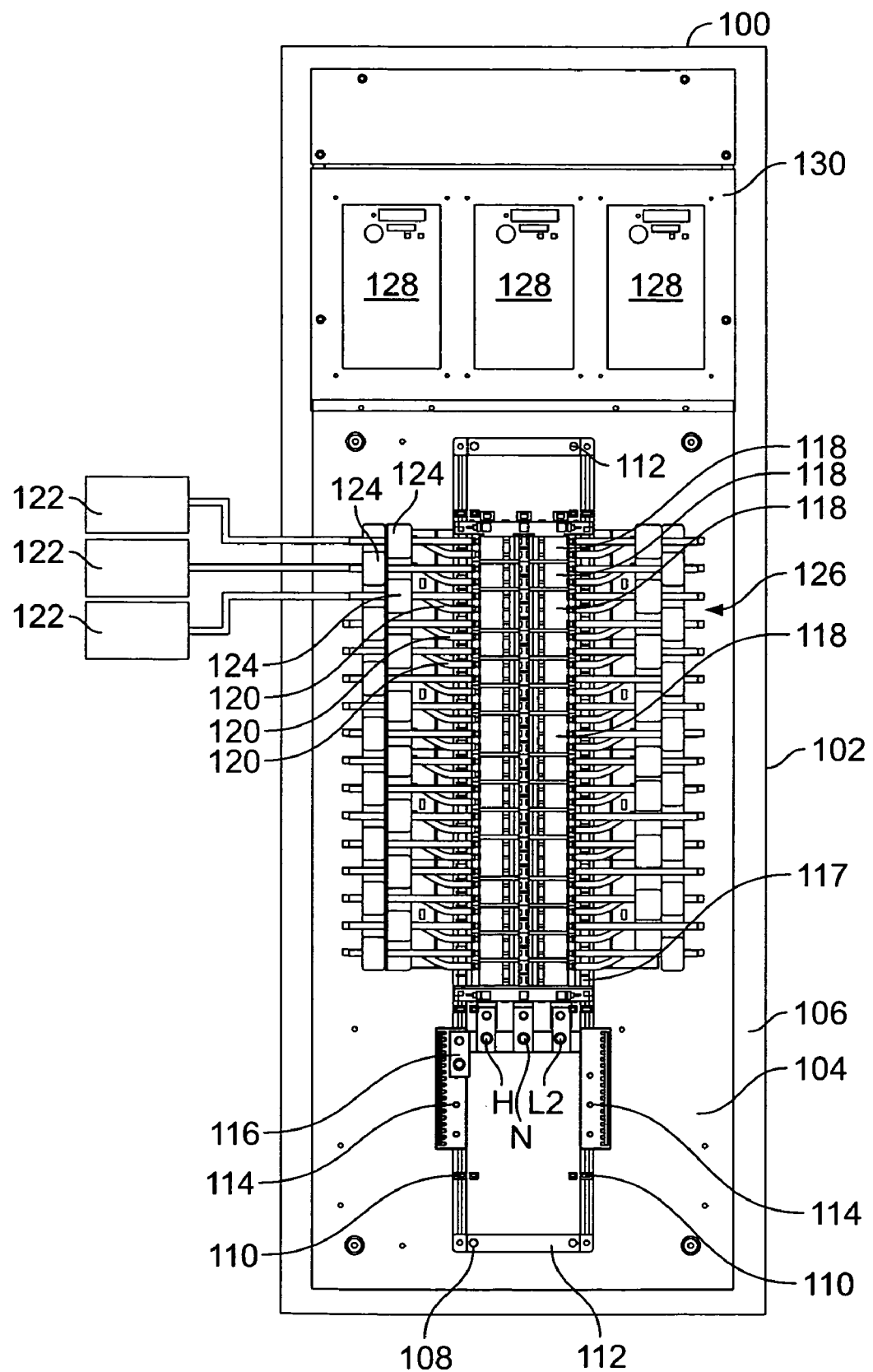
FIG. 1 is a an isometric view of an exemplary electrical distribution panel with the cover removed.

FIG. 1 is an isometric view of an exemplary distribution panel 100 with a cover (not shown) removed in accordance with an embodiment of the present invention. In the exemplary embodiment, distribution panel 100 includes a base 102 that may include one or more sidewalls extending therefrom to define an at least partially enclosed space. A backplane 104 may be coupled to an interior surface 106 of base 102. Backplane 104 may be coupled directly to surface 106 or may be separated from surface 106 by standoffs or spacers (not shown) positioned between surface 106 and backplane 104 such that a gap is defined between surface 106 and backplane 104. Distribution panel 100 further includes a channel assembly 108 mounted to surface 106 for mounting distribution panel components as described below. Channel assembly 108 includes one or more rails 110 and one or more mounting strips 112 that are used to couple channel assembly 108 to surface 106.

A termination strip 114 may be coupled to channel assembly 108 for receiving a neutral circuit conductor 116 from a mains. A circuit breaker base 117 is coupled to channel assembly 108 to provide a stable mounting platform for electrical distribution panel components. A plurality of circuit breakers 118 may be coupled to circuit breaker base 117 such that contacts within circuit breaker 118 (not shown) may engage a plurality of alternating current (AC) power lines L1, L2, neutral line N. Lines L1, L2, N supply voltage, for example, conventional 120/240 VAC, single phase, three wire) to distribution panel 100 from a mains. A load conductor 120 from each circuit breaker 118 transmits load current from each circuit breaker 118 to a respective load 122. Load conductor 120 passes through a corresponding load sensor 124 of a load sensing assembly 126. In the exemplary embodiment, load sensor 124 is illustrated as a current transformer having a primary circuit of a first predetermined number of turns and a secondary circuit having a second predetermined number one turns. It should be understood that load sensor 124 may be any sensing device capable of performing the functions described herein.

One or more modular sub metering electronics 128 may be mounted in distribution panel 100 in a housing 130 or may be mounted in a separate enclosure (not shown in FIG. 1). Housing 130 facilitates protecting sub-metering electronics 128 and defines a wire gutter for input wires carrying signals from load sensors 124.

Figure 2:
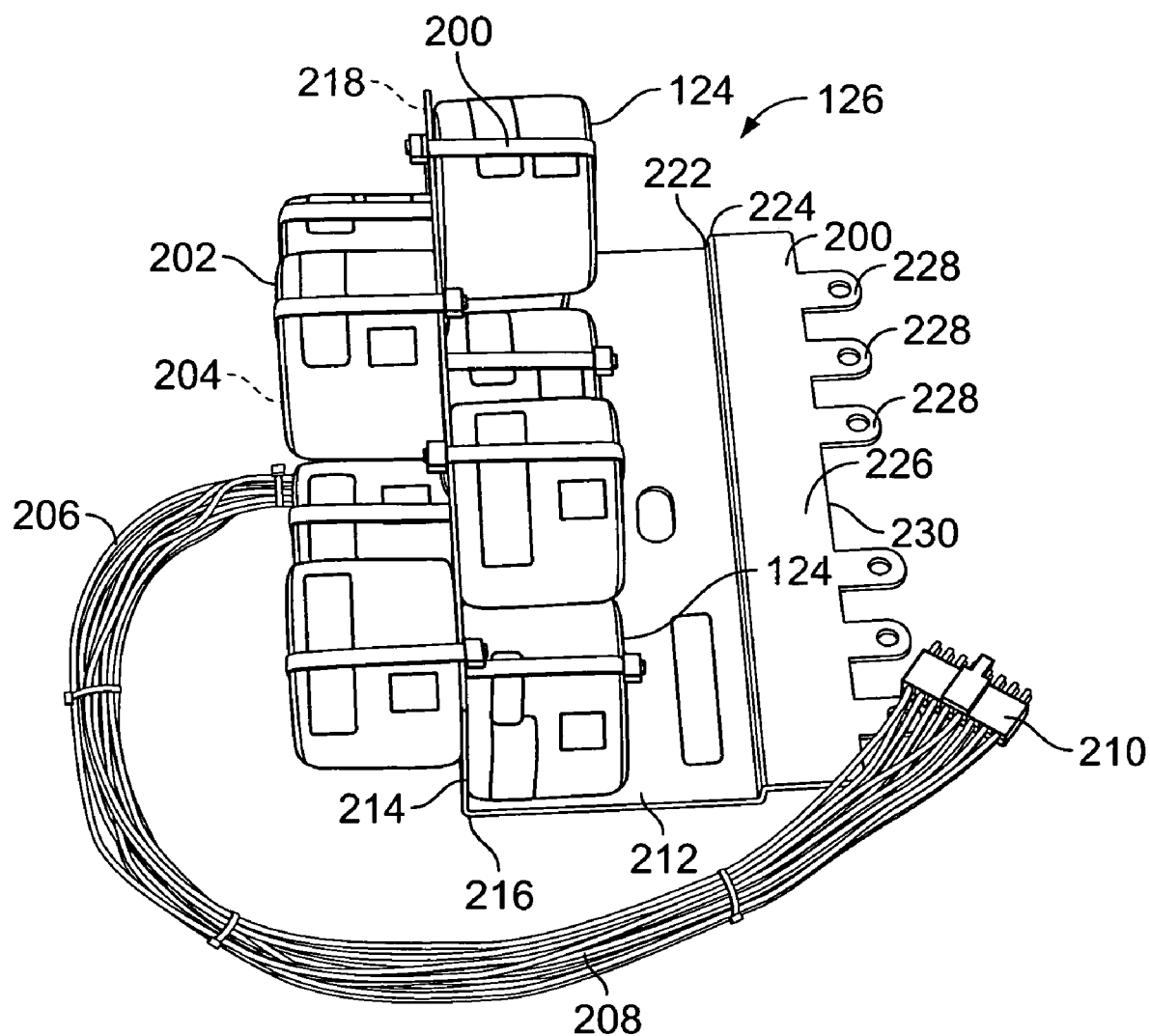
FIG. 2 is a perspective view of an exemplary load sensing assembly that may be used with the electrical distribution panel shown in FIG. 1.

FIG. 2 is a perspective view of an exemplary load sensing assembly 126 (shown in FIG. 1). Load sensing assembly 126 includes a plurality of load sensors 124 coupled to an L-bracket 200 in groups and stacked in parallel rows. L-bracket 200 is of a poke-yoke design that facilitates preventing installation in a position other than the design position. Load sensing assembly 126 is configured to be coupled to distribution panel 100 on an outboard side of a group of circuit breakers 118 along a sidewall of distribution panel 100. In the exemplary embodiment, each of load sensors 124 is a current transformer having a body 202 including an aperture 204 therethrough for the passage of a respective load conductor 120. Output signal lines 206 from each load sensor 124 are bundled into a cable 208 having a pre-installed wire termination connector 210. Cable 208 is fabricated of a cable having a predetermined length such that connector 210 may be coupled to a complementary wire termination connector (not shown) with a minimum of doubleback of cable 208.

L-bracket 200 includes a substantially planar body portion 212 extending between a mounting portion 214 that extends approximately perpendicularly from an edge 216 of body portion 212. Mounting portion 214 includes a plurality of apertures 218, for example, one aperture for each respective load sensor 124 that is mounted to mounting portion 214. The aperture permits passage of load conductor 120 associated with load sensor 124 and a fastener 220 configured to maintain load sensor 124 in a predetermined position with respect to each other load sensor 124 and mounting portion 214. L-bracket 200 is of a "poke-yoke" design such that dimensions of L-bracket 200 and/or a lack of symmetry substantially prevents L-bracket 200 from being installed incorrectly. For example, an edge 222 opposite edge 216 includes a stepped portion 224 that includes a substantially planar portion 226 that is parallel to but not co-planar with body portion 212. In the exemplary embodiment, stepped portion 224 includes a plurality of locking tabs that may be symmetrically spaced along a distal edge 230 of stepped portion 224.

Figure 3:
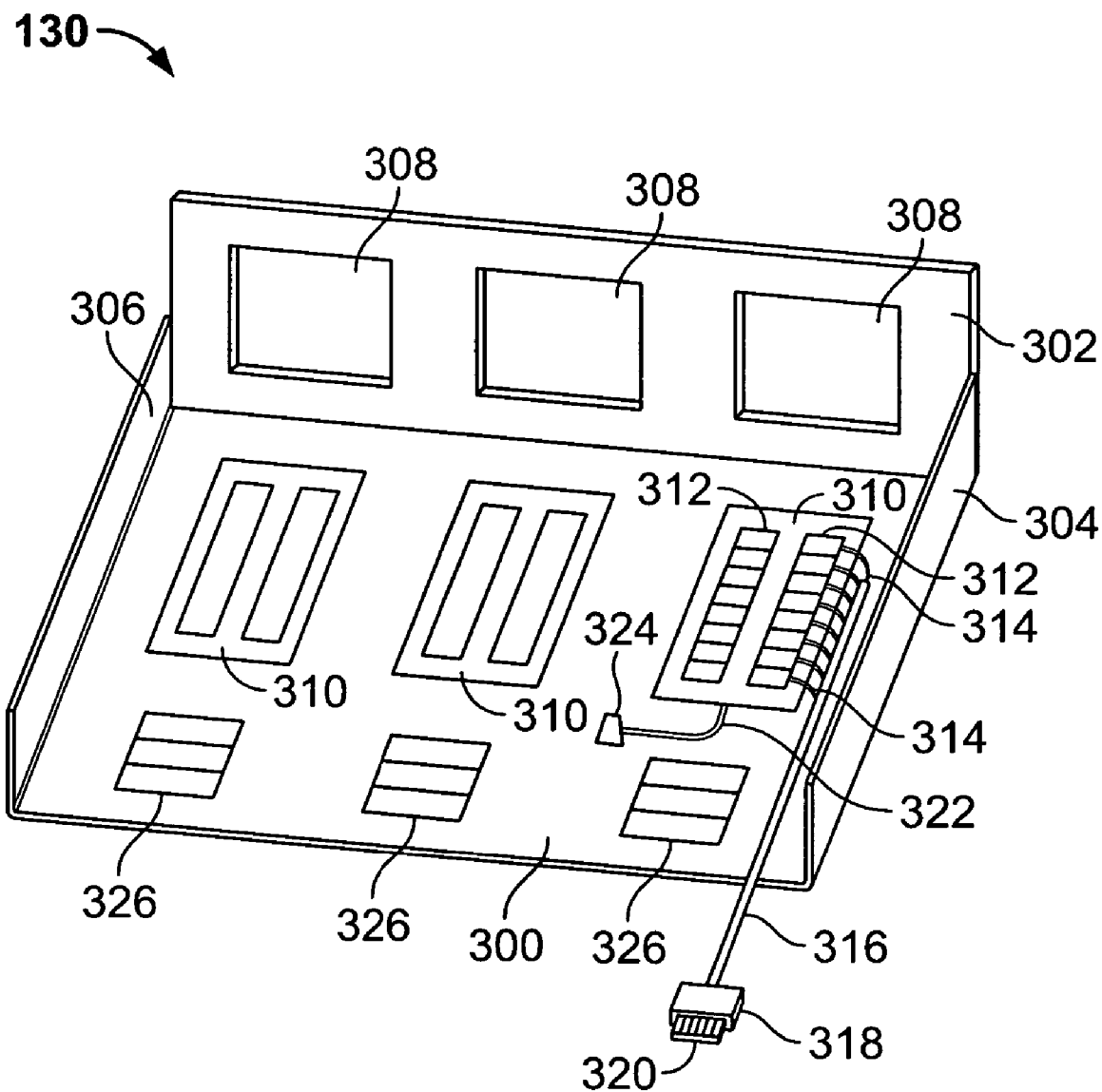
FIG. 3 is a perspective view of the housing, shown in FIG. 1, with the cover removed.

FIG. 3 is a perspective view of housing 130 (shown in FIG. 1) with the cover removed. Housing 130 includes a back wall 300 and a top wall 302 extending substantially perpendicularly from back wall 300. A first sidewall 304 and a second sidewall 306 extend from back wall 300 on sides that are each adjacent to top wall 302. In the exemplary embodiment, a plurality of fuse blocks 308, for example one fuse block for each modular sub metering electronics 128, is located within housing 130. One or more interface boards 310 may be mounted on back wall 300 such that a terminal strip extending along interface board 310 is conveniently accessible to terminals 314 of a pre-wired signal cable 316. In the exemplary embodiment, cable 316 may be a plurality of separately insulated conductors bound together within a sheath, such as an insulative sheath and/or an abrasion resist jacket. In an alternative embodiment, the cable is formed of a plurality of separately insulated conductors bound together using, for example wire-ties spaced along the length of the cable for maintaining the conductors in close proximity with respect to each other. A termination connector 318 includes a plurality of pins 320 configured to engage sockets in a complementary termination connector 210 (shown in FIG. 2). Connectors 210 and 318 may also be shaped asymmetrically and/or include keys that facilitate coupling in only one configuration. Interface board 310 includes a pre-wired output cable 322 that includes a termination connector 324 configured to couple to modular sub metering electronics 128. Interface board 310 is configured to receive analog load signals from at least one current transformer 124 and generate at least one of a digital signal and a converted analog signal that is indicative of a value of the received analog signals. A plurality of electrical disconnects are mounted in housing 130 along back wall 300 for permitting deenergization of components within housing 130, such as interface board 310, modular sub metering electronics 128, and/or a meter head (not shown in FIG. 3) coupled to modular sub metering electronics 128.

Figure 4:
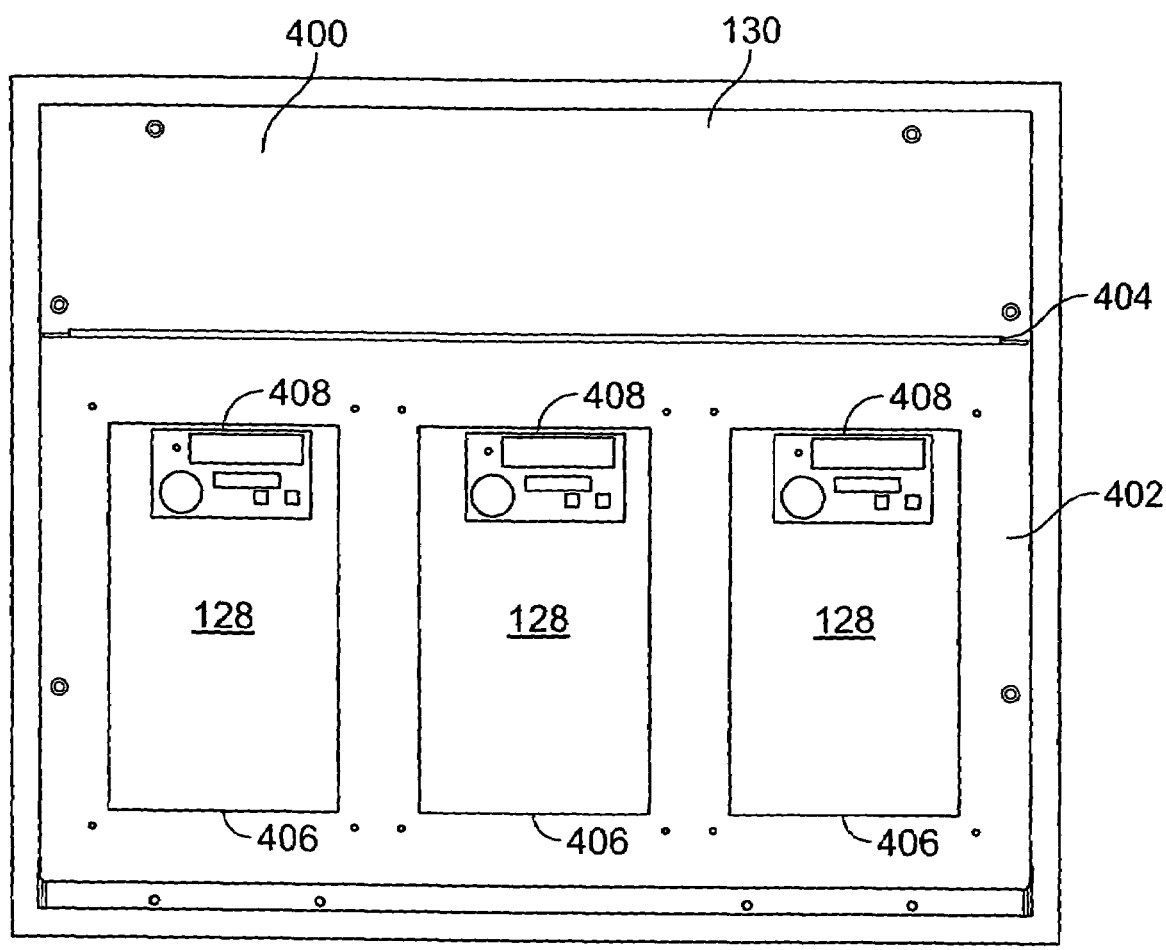
FIG. 4 is an enlarged perspective view of an exemplary housing shown in FIG. 1.

FIG. 4 is an enlarged perspective view of housing 130 (shown in FIG. 1). Housing 130 includes an upper access cover 400 and a lower access cover 402 coupled together through a hinge 404 such as a piano hinge. Covers 400 and 402 provide convenient access to components within housing 130. Access cover 402 includes cutouts 406 sized to accommodate modular sub metering electronics 128. Each modular sub metering electronics 128 includes a meter unit 408. In the exemplary embodiment, housing 130 is mounted to distribution panel 100 as an integral component of distribution panel 100. In an alternative embodiment, housing 130 is mounted separately from distribution panel 100 in a location generally proximate to distribution panel 100. As such, housing 130 and load sensing assembly 126 facilitates sub-metering a power distribution system as a retrofit to an existing power distribution system or as a new installation. For example, housing 130 and load sensing assembly 126 may be installed into distribution panel 100 in a factory environment and may be installed into distribution panel 100 in a field installation environment.

During operation, for example, a method of measuring sub-branch loads 122 in an electrical distribution panel 100 includes mounting a load sensing assembly 126 proximate a branch circuit breaker 118 at least partially within the distribution panel, the load sensing assembly 126 including a plurality of load sensors 124 wherein each load sensor 124 is configured to generate an output signal that is proportional to an electrical load in a branch circuit. Each load sensor 124 includes at least one output signal lead 206 electrically coupled to a first termination connector 210. The method further includes coupling that at least one output signal lead 206 to a signal wire 316 using the first termination connector 210 and a complementary second termination connector 318 that is electrically coupled to the signal wire. A load profile for at least a portion of the branch circuit is determined using the respective branch circuit load signals.

As discussed previously, the electrical distribution panel 100 includes a base 102 having a plurality of slots positioned in predetermined locations along the base 102. The load sensing assembly 126 includes an L-bracket 200 having at least one engagement tab 228. In one embodiment, mounting load sensing assembly 126 includes positioning the at least one engagement tab 228 within a predetermined complementary slot within the base 102, and fixedly coupling the L-bracket 200 to the base 102 using at least one of a fastener, a friction engagement, an interference fit, and an adhesive.

In one embodiment, coupling the at least one output signal lead 206 to a respective signal wire 316 using the first termination connector 210 and a complementary second termination connector 318 comprises coupling a pre-wired output cable 316 including the at least one output lead to a pre-wired signal cable including the signal wires using the first termination connector 210 and the second termination connector 315.

In one embodiment, coupling the output cable 206 to the signal cable 316 comprises electrically coupling the signal cable 316 to a sub-metering electronics interface board 310.

In one embodiment, the method includes communicatively coupling an interface board 310 to the sub-metering electronics 128.

While the present invention is described with reference to an apartment dwelling or multi-family unit, numerous other applications are contemplated. It is contemplated that the present invention may be applied to any commonly owned and subleased facilities, including facilities, such as commercial facilities, office buildings, or a campus of buildings, as well as, industrial facilities, and facilities that produce discrete product outputs, such as, factories.

The above-described systems and methods of submetering power distribution in a modular, pre-fabricated, error-proofed form is cost-effective and highly reliable for monitoring and managing the metering operation of facilities. More specifically, the methods and systems described herein facilitate determining system load attributable to each branch circuit. As a result, the methods and systems described herein facilitate determining branch owner power costs in a cost-effective and reliable manner.

Exemplary embodiments of real-time electrical distribution submetering systems and methods are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. An electrical distribution submetering system comprising:
   a modular load sensing assembly comprising a plurality of load sensors configured to detect an electrical load of at least one circuit and generate a load signal proportional to the electrical load, said load sensing assembly further comprising a first cable having a first cable termination connector coupled to at least one conductor of the first cable;
   an interface board comprising a plurality of electrical terminations, at least some of said terminations electrically coupled to a second cable having a second cable termination connector coupled to at least one conductor of the second cable, said second cable termination connector being complementary to said first cable termination connector such that said first cable termination connector and said second cable termination connector are configured to be electrically coupled to each other for transmitting load signals therethrough; and
   a modular sub metering electronics communicatively coupled to said interface board, said modular sub metering electronics configured to determine a branch circuit load in said electrical distribution system using the detected electrical load.

2. An electrical distribution submetering system in accordance with claim 1 wherein said load sensing assembly comprises an L-shaped mounting bracket configured to be coupled to a circuit breaker base such that an aperture of said L-shaped mounting bracket is aligned with a circuit breaker load carrying terminal.

3. An electrical distribution submetering system in accordance with claim 2 further comprising a distribution panel comprising said circuit breaker base wherein said L-shaped mounting bracket comprises at least one engagement tab configured to interlock with a corresponding slot formed in said circuit breaker base.

4. An electrical distribution submetering system in accordance with claim 2 further comprising a distribution panel comprising said circuit breaker base wherein said L-shaped mounting bracket comprises at least one engagement tab configured to interlock with a corresponding slot formed in said circuit breaker base, said tabs and slots positioned to facilitate a predetermined alignment of the L-shaped mounting bracket with respect to said circuit breaker base.

5. An electrical distribution submetering system in accordance with claim 1 wherein said plurality of load sensors are coupled to an L-shaped mounting bracket, at least one of said load sensors comprising an aperture therethrough, said L-shaped mounting bracket configured to be coupled to a circuit breaker base such that said aperture is aligned with a circuit breaker load carrying terminal.

6. An electrical distribution submetering system in accordance with claim 1 wherein said first cable comprises:
   a plurality of individually insulated conductors having a predetermined length;
   said first cable termination connector electrically coupled to a first end of said conductors; and
   a second end coupled to an output of said plurality of load sensors.

7. An electrical distribution submetering system in accordance with claim 1 wherein at least one of said plurality of load sensors comprises a current transformer.

8. An electrical distribution submetering system in accordance with claim 1 wherein said interface board is configured to receive analog load signals from at least one current transformer and generate at least one of a digital signal and a converted analog signal that is indicative of a value of the received analog signals.

9. An electrical distribution submetering system in accordance with claim 1 wherein said modular sub metering electronics further comprises a meter unit communicatively coupled to said modular sub metering electronics.

10. A load sensing assembly comprising:
    a plurality of load sensors configured to be communicatively coupled to respective load carrying branch circuit conductors, said plurality of load sensors configured to generate a load signal proportional to the load carried in the respective branch circuit conductors;
    a plurality of output leads, each said output lead coupled to an output of a respective said load sensor, said output leads coupled to a termination connector comprising a first shape and a plurality of pin connections, said pin connections configured to mate in one-to-one correspondence with said output leads, said first shape configured to mate to a complementary second-shaped connector; and
    an L-bracket comprising a poke-yoke configuration that facilitates preventing installation of said L-bracket in other than a predetermined orientation, said L-bracket configured to support said plurality of load sensors in substantial alignment with respective load carrying branch circuit conductors.

11. A load sensing assembly in accordance with claim 10 wherein said L-bracket further comprises:
   a substantially planar body portion extending between a first edge and an opposite second edge;
   a load sensor mounting portion that extends approximately perpendicularly from said first edge, said load sensor mounting portion including a plurality of openings configured to align said plurality of load sensors with said respective load carrying branch circuit conductors; and
   a stepped portion extending along said second edge and comprising a plurality of locking tabs.

12. A load sensing assembly in accordance with claim 10 wherein said load sensors comprise current transformers.

13. A load sensing assembly in accordance with claim 10 wherein said plurality of output leads comprises a multi-conductor cable.

14. A load sensing assembly in accordance with claim 10 wherein said L-bracket is configured to support said plurality of load sensors oriented in parallel adjacent rows.

15. A method of measuring sub-branch loads in an electrical distribution panel, said method comprising:
   mounting a load sensing assembly proximate a branch circuit breaker at least partially within the distribution panel, the load sensing assembly including a plurality of load sensors, each load sensor configured to generate an output signal that is proportional to an electrical load in a branch circuit, each load sensor comprising at least one output signal lead electrically coupled to a first termination connector;
   coupling the at least one output signal lead to a signal wire using the first termination connector and a complementary second termination connector electrically coupled to the signal wire; and
   determining, using the respective branch circuit load signals, a load profile for at least a portion of the branch circuit.

16. A method in accordance with claim 15 wherein the electrical distribution panel includes a base having a plurality of slots positioned in predetermined locations along the base, the load sensing assembly including an L-bracket having at least one engagement tab, and wherein mounting a load sensing assembly comprises:
   positioning the at least one engagement tab within a predetermined complementary slot within the base; and
   fixedly coupling the L-bracket to the base using at least one of a fastener, a friction engagement, an interference fit, and an adhesive.

17. A method in accordance with claim 15 wherein the load sensing assembly includes at least one load sensor coupled to an L-bracket, the load sensor having an aperture therethrough, and wherein mounting a load sensing assembly comprises:
   mounting the load sensing assembly adjacent a load circuit breaker; and
   directing a load conductor from the circuit breaker to a load through the aperture.

18. A method in accordance with claim 15 wherein coupling the at least one output signal lead to a respective signal wire using the first termination connector and a complementary second termination connector comprises coupling a pre-wired output cable including the at least one output lead to a pre-wired signal cable including the signal wires using the first termination connector and the second termination connector.

19. A method in accordance with claim 18 wherein coupling the output cable to the signal cable comprises electrically coupling the signal cable to a sub-metering electronics interface board.

20. A method in accordance with claim 15 further comprising communicatively coupling an interface board to the sub-metering electronics.

21. A method in accordance with claim 15 further comprising mounting the sub-metering electronics within the electrical distribution panel.

22. A method in accordance with claim 15 further comprising mounting the sub-metering electronics in a separate panel proximate the electrical distribution panel.

* * * * *